(12) United States Patent
Fang

(10) Patent No.: US 9,972,553 B1
(45) Date of Patent: May 15, 2018

(54) PACKAGING SYSTEM WITH CLEANING CHANNEL AND METHOD OF MAKING THE SAME

(71) Applicant: Sandia Corporation, Albuquerque, NM (US)

(72) Inventor: Lu Fang, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days. days.

(21) Appl. No.: 15/388,210

(22) Filed: Dec. 22, 2016

Related U.S. Application Data

(60) Provisional application No. 62/275,658, filed on Jan. 6, 2016.

(51) Int. Cl.
| | | |
|---|---|---|
| *H01L 23/31* | (2006.01) | |
| *H01L 25/065* | (2006.01) | |
| *H01L 23/057* | (2006.01) | |
| *H01L 23/498* | (2006.01) | |
| *H01L 21/50* | (2006.01) | |

(52) U.S. Cl.
CPC ............ *H01L 23/057* (2013.01); *H01L 21/50* (2013.01); *H01L 23/315* (2013.01); *H01L 23/49805* (2013.01); *H01L 25/065* (2013.01)

(58) Field of Classification Search
CPC .............................. H01L 25/065; H01L 23/315
See application file for complete search history.

(56) References Cited

U.S. PATENT DOCUMENTS

| | | | |
|---|---|---|---|
| 5,210,683 A * | 5/1993 | Ley ....................... | H01L 23/642 361/307 |
| 6,368,895 B1 | 4/2002 | Hori | |
| 8,378,472 B2 | 2/2013 | Matsuno et al. | |
| 2002/0162679 A1 * | 11/2002 | Hannan ................. | H01L 21/563 174/528 |

(Continued)

OTHER PUBLICATIONS

Vishay Intertechnology Inc. ("Vishay", "Surface-Mount Optocoupler Packages Article" available online as of Oct. 20, 2016 via archiving at Wayback Machine https://web.archive.org/web/20161020042420/http://www.vishay. com/docs/49447/49447.pdf and available online at http://www.vishay.com/docs/49447/ 49447.pdf pp. 1-4.*

(Continued)

*Primary Examiner* — Asok K Sarkar
*Assistant Examiner* — Grant Withers
(74) *Attorney, Agent, or Firm* — Martin I. Finston

(57) ABSTRACT

A packaging structure and method for surface mount integrated circuits reduces electrochemical migration (ECM) problems by including one or more cleaning channels to effectively and efficiently remove flux residue that may otherwise remain lodged in gaps between the surface mount package and the printed circuit board. A cleaning channel may be formed along a bottom surface of the surface mount package (i.e., the surface facing the printed circuit board), or along a portion of a top surface of the printed circuit board. In either case, the inclusion of a cleaning channel enlarges the gap between the bottom surface of the surface mount package and the printed circuit board and creates a path for contaminants to be flushed out during a cleaning process.

7 Claims, 5 Drawing Sheets

(56) References Cited

U.S. PATENT DOCUMENTS

2002/0166687 A1* 11/2002 Tornovist ............. H01L 23/295
   174/521
2005/0189635 A1* 9/2005 Humpston ............ B81B 7/0077
   257/678
2005/0247761 A1 11/2005 Albanese et al.

OTHER PUBLICATIONS

Reliability Assessment of Ion Contamination Residues on Printed Circuit Board, M.T.T. Nguyen, University of South Florida, Jan. 2013.
A Review of Models for Time-to-Failure Due to Metallic Migration Mechanisms, Bumiller and Hillman, Aug. 28, 2016.
Effect of Flux Systems on Electrochemical Migration of Lead-Free Assembly, Wei and Tolla, SMTA International Conference & Exhibition, Sep.-Oct. 2014.
Solder Paste Residue Corrosivity Assessment: Bono Test Céline Puechagut et al, Microelectronics Packaging Conference (Europe), Sep. 14-16, 2015.

* cited by examiner

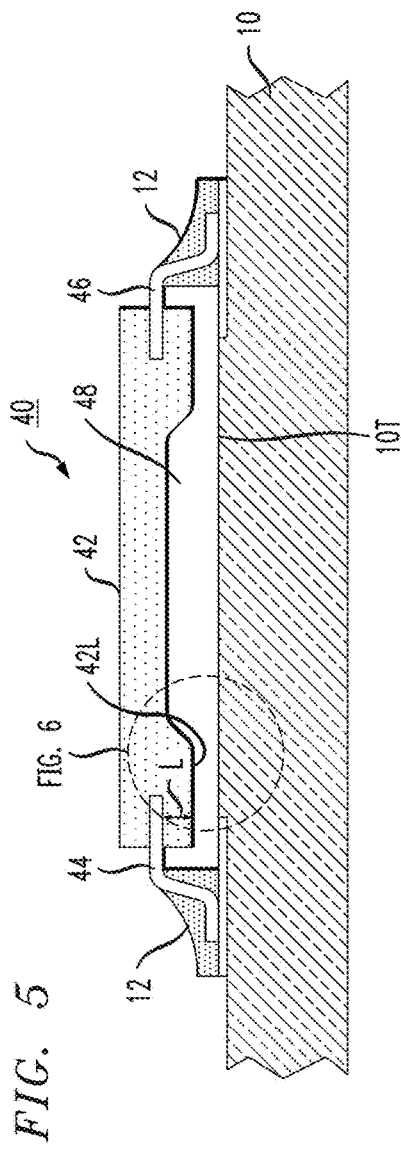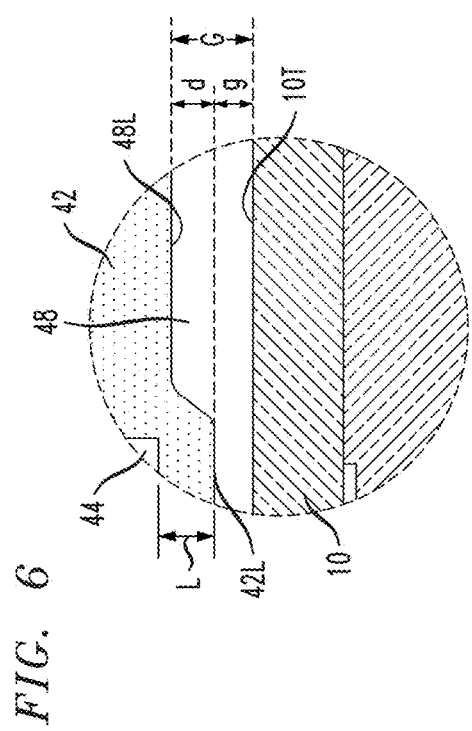

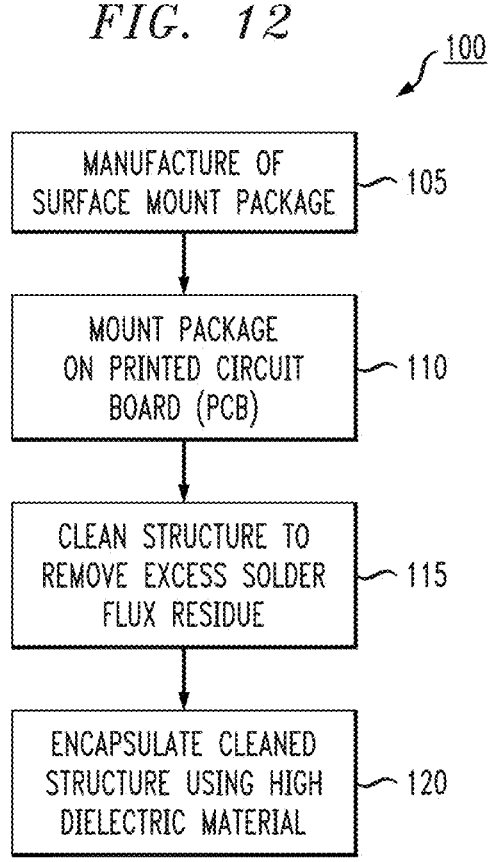

PACKAGING SYSTEM WITH CLEANING CHANNEL AND METHOD OF MAKING THE SAME

CROSS-REFERENCE TO RELATED APPLICATIONS

This application claims the benefit of U.S. Provisional Application 62/275,658, filed Jan. 6, 2016 and herein incorporated by reference.

STATEMENT OF GOVERNMENT INTEREST

This invention was made with Government support under Contract No. DE-AC04-94AL85000 awarded by the U.S. Department of Energy to Sandia Corporation. The Government has certain rights in the invention.

BACKGROUND

Various packaging configurations in the semiconductor industry include "surface mounted" packages attached to a printed circuit board (PCB). The packages are both physically and electrically attached to the PCB, with an appropriate type of solder (solder paste) utilized to provide the physical attachment while also providing an electrical connection path between the packages and bond pad locations on the PCB. Some of the packages have leads that extend beyond the outer perimeter of the package housing, while others include electrical contacts formed on a lower package surface (the latter type mating with "solder bumps" on the PCB surface).

When soldering a package onto a PCB, a soldering flux is often mixed with the solder in order to reduce the creation of oxides on either the leads or bond pads. Once the soldering process is completed, corrosive residues of the soldering flux typically remain in the gaps between the top surface of the PCB and the lower surface of the package housing. While the structure is subjected to a cleaning process before performing a next type of encapsulation, the gap between the surfaces may be so small (e.g., less than a millimeter or so) that some of the flux residue cannot be dislodged. As a result, this flux residue becomes embedded within final encapsulated product.

Unfortunately, this embedded flux residue can accelerate the failure of the circuitry by virtue of electrochemical migration (ECM). ECM can be defined in this situation as a movement of metal ions (in the flux residue) through the PCB under the influence of an applied DC bias voltage. This movement produces a dendrite type of morphology; structures such as "tree-like" or "feather-like" filaments that grow through the flux residues between two adjacent metal stripes (or opposing electrodes) as a function of the applied voltage. The higher the applied voltage (i.e., electrical potential differential), the faster the filaments form and grow. If severe enough, ECM leads to current leakage and intermittent shorts within the circuit structure and, consequently, increases the chances for catastrophic failure.

While high pressure deionized water provides the safest means of PCB cleaning, the extremely low clearances between the PCB and mounted packages cannot always ensure that all flux residue has been eliminated.

SUMMARY

One aspect of the present invention relates to a packaging structure for surface mount integrated circuits that reduces ECM problems by including one or more cleaning channels to effectively and efficiently remove flux residue that may otherwise remain lodged in gaps between the surface mount package and the printed circuit board.

In one embodiment, a cleaning channel is formed along a bottom surface of the surface mount package (i.e., the surface facing the printed circuit board). In another embodiment, a cleaning channel is formed along a portion of a top surface of the printed circuit board. In either case, the inclusion of a cleaning channel enlarges the gap between the bottom surface of the surface mount package and the printed circuit board and creates a path for contaminants to be flushed out during a cleaning process. It is contemplated that multiple cleaning channels may be included in the configuration.

The contaminants may include flux residue from previous soldering operations. The residue includes metallic ions that are known to be associated with electrochemical migration (ECM), particularly under harsh environments such as high humidity, creating dendrites that grow between adjacent metal strips that result in causing intermittent shorts (or worse) in the structure.

One exemplary embodiment of the present invention takes the form of a packaging system including a surface mounted integrated circuit package, a printed circuit board for supporting physical attachment and electrical connections to the surface mounted integrated circuit package, and at least one cleaning channel formed between opposing surfaces of the printed circuit board and the surface mounted integrated circuit package, the at least one cleaning channel providing an enlarged gap therebetween to enhance removal of solder flux residue and minimize electrochemical migration-based packaging system failure.

Another exemplary embodiment takes the form of a method for packaging a surface mount integrated circuit, the method comprising providing a surface mount integrated circuit, providing a printed circuit board, soldering the surface mount integrated circuit to the printed circuit board, creating a cleaning channel in a gap between the surface mount integrated circuit and the printed circuit board and, applying cleaning fluid to remove contaminants from the soldered combination of the surface mount integrated circuit and the printed circuit board. The application of cleaning fluid, particularly within the cleaning channels, will remove contaminants residing in the gap between the surface mount integrated circuit and the printed circuit board.

A further embodiment of the present invention relates to a package structure for surface mounted integrated circuits, the package structure formed to include a cleaning channel across the bottom surface for preventing the accumulation of flux residue in a final encapsulated structure.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings:

FIG. 5 is a cut-away view of an exemplary embodiment of the present invention, in which a surface mount integrated circuit package is formed to include a cleaning channel in its outer housing;

FIG. 6 is an enlargement of a portion of the inventive packaging system as shown in FIG. 4, particularly illustrating the creation of a cleaning channel between the package housing and the PCB;

FIG. 12 is a flow chart of a set of steps used in the attachment of a surface mount integrated circuit package to a printed circuit board.

DETAILED DESCRIPTION, WITH EXAMPLES

Figure 1:
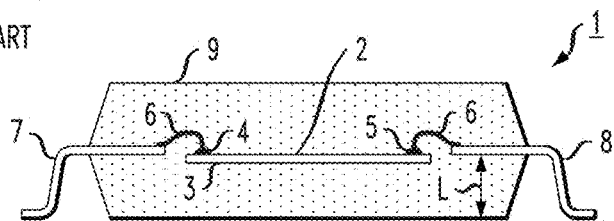
FIG. 1 is a cut-away view of a conventional, prior art surface mount integrated circuit package.

FIG. 1 illustrates a typical surface mount package 1 which may be attached to a printed circuit board (PCB) as part of a larger integrated circuit system. Package 1 is shown to include an integrated circuit die 2 mounted on a support 3. In this particular configuration, a pair of electrical contacts 4, 5 is shown on the top surface of die 2. These contacts are connected via wirebonds 6 to a pair of leads 7, 8 that exit package 1. In most cases, the components contained within package 1 are disposed within a housing 9 (typically formed of an inert material such as plastic molding compounds).

Figure 2:
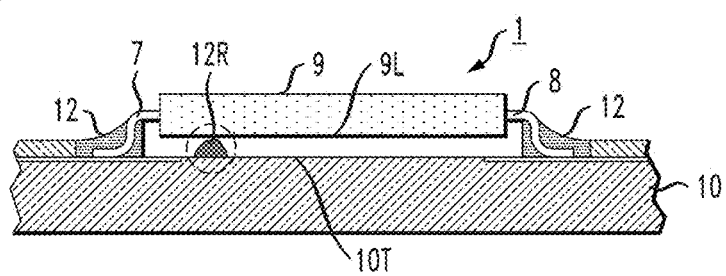
FIG. 2 is a cut-away view of the conventional surface integrated circuit package of FIG. 1 attached to a printed circuit board (PCB)
Figure 4:
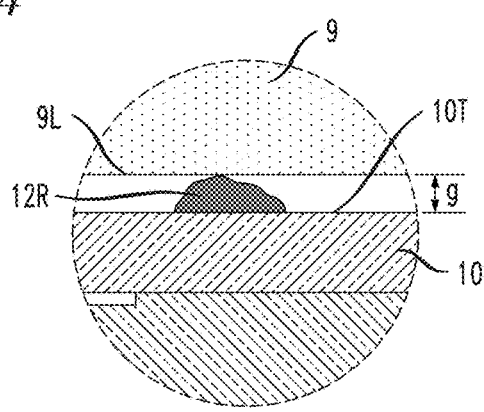
FIG. 4 is an enlargement of a portion of the view of either FIG. 2 of FIG. 3, showing flux residue trapped between the surface mount package and the PCB.

FIG. 2 is a prior art illustration of package 1 attached to a printed circuit board (PCB) 10. A solder material 12 is used to physically and electronically attach leads 7, 8 of package 1 to PCB 10. The solder is typically applied as a "paste" type of composition, consisting of (for example) lead, tin, silver, zinc, antimony, indium, bismuth, cadmium, gold, aluminum, phosphorus, arsenic, or copper. As mentioned above, a cleaning process is used to remove extraneous solder material from a PCB-based assembly once all of the surface mounted packages have been attached to the PCB. While removing most of the extraneous material, it is typical for some flux residue to remain lodged in places that are difficult to clean. One exemplary residue location is shown in FIG. 2 as a gap "g" between the lower surface 9L of housing 9 and the top surface 10T of PCB 10. (The gap "g" is indicated in FIG. 4.) A portion of flux residue, denoted 12R, is shown as disposed within this gap.

Figure 3:
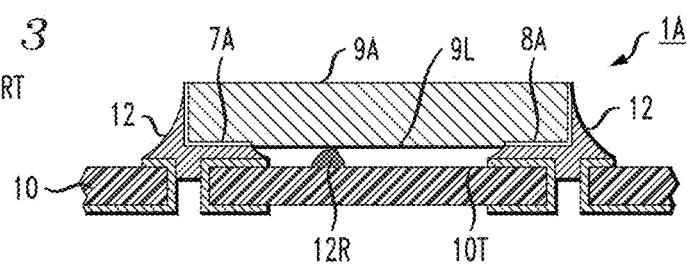
FIG. 3 is a cut-away view of an alternative prior art surface mount integrated circuit package, in this case including electrical contacts on the bottom surface of the package housing.

As mentioned above, another type of surface mount package (sometimes referred to as a "leadless package") utilizes a set of electrical contacts formed on its lower surface to connect to a PCB. FIG. 3 is a prior art illustration of this alternative package 1A, disposed on PCB 10. In this case, a pair of contact regions 7A and 8A are formed on lower surface 9L of housing 9, with solder 12 used to provide physical and electrical connections between these contacts and the circuitry on PCB 10. It is evident that the gap "g" (indicated in FIG. 4) between lower surface 9L of package 1A and top surface 10T of PCB 10 is in the same range as that associated with the prior art configuration of FIG. 2. Again, a portion of flux residue 12R is shown as lodged between lower surface 9L and top surface 10T. Thus, problems associated with flux residue also arise with this type of leadless surface mount package.

FIG. 4 is a close-up view of residue 12R, shown as lodged within a gap "g" between lower surface 9L and top surface 10T. In most cases, this gap g ranges in size between 0.02 mm to 0.2 mm. This relatively small gap size makes complete removal of flux residue difficult, leading to the above-described ECM problems and device failure possibilities.

FIG. 5 is a cross-sectional view of a surface mount package 40 formed in accordance with one or more embodiments of the present invention. Surface mount package 40 includes various integrated circuit dies (not shown) enclosed within a housing 42. In this particular embodiment, a pair of external leads 44, 46 exit through opposing sidewalls of housing 42 and contact top surface 10T of PCB 10. As with the prior art, a solder material 12 is used to attach leads 44, 46 to top surface 10T of PCB 10.

In accordance with one or more embodiments of the present invention, housing 42 is formed to include a cleaning channel 48, formed within lower housing surface 42L in the manner shown in FIG. 4. By virtue of including cleaning channel 48 in the physical design of housing 42, the size of the gap between package 40 and PCB 10 is increased. Therefore, a conventional PCB cleaning process is more likely to be able to eliminate flux residues and other contaminants that remain in the gap between surface mount package 40 and PCB 10. In particular, cleaning channel 48 allows for a higher level of solvent flow, while also promoting more thorough flux residue removal activities during the cleaning processes after the solder application step.

FIG. 6 illustrates an enlarged view of a portion of the structure of FIG. 5, showing in particular the relationship between cleaning channel 48, lower housing surface 42L and top surface 10T of PB 10. As shown, cleaning channel 48 is shown to exhibit a depth d as measured from lower surface 42L of housing 42 to a lower channel surface 48L. The depth d of cleaning channel 48 may be such that the resulting gap G between PCB top surface 10T and lower surface 48L of cleaning channel 48 is in the range of about 0.2 mm to 1.0 mm. These dimensions are exemplary only, other cleaning channel dimensions may be effective, depending on the overall dimensions of the surface mount package housings. It is to be understood that the presence of the integrated circuit die within the package limits the amount of indentation into the package represented by the depth d (as measured between lower housing surface 42L and lower surface 48L of cleaning channel 48). Thus, it is desirable to limit d so that the cleaning channel 48 does not extend as far as the location of leads 44, 46. In FIG. 6, leads 44, 46 are shown as positioned at a distance "L" above lower housing surface 42L. Hence the depth d of cleaning channel 48 preferably remains less than L so that cleaning channel 48 does not expose leads 44, 46.

Figure 7:
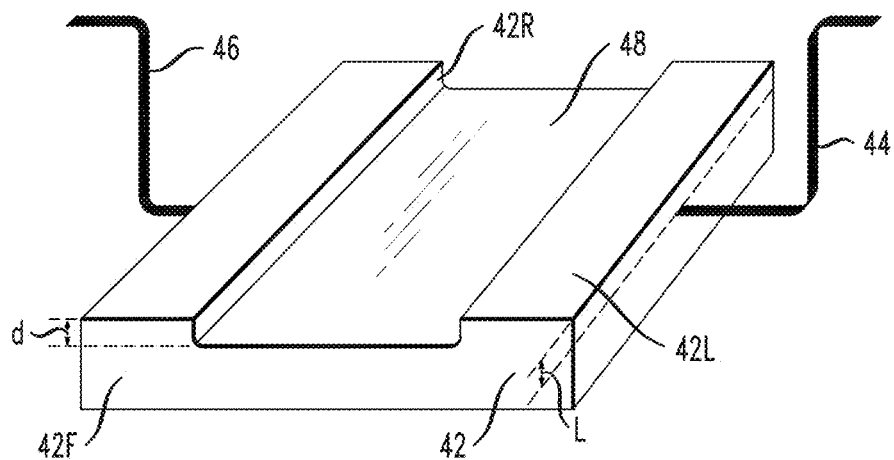
FIG. 7 is an isometric view on a bottom surface of the outer housing of FIG. 5, in this case illustrating the cleaning channel formed within the bottom surface.
Figure 8:
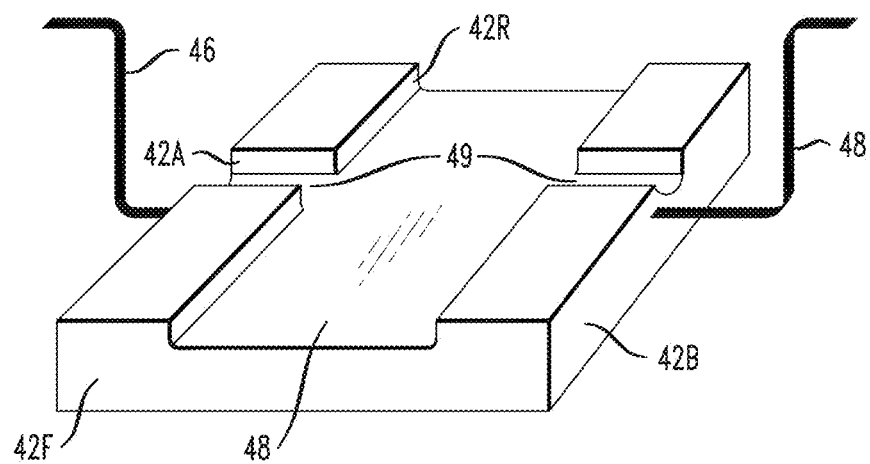
FIG. 8 is an isometric view of an alternative cleaning channel configuration, showing a pair of channels formed in the bottom surface of the outer housing of a surface mount package.

FIG. 7 is an isometric view of the underside of housing 42, showing the formation of cleaning channel 48 along lower housing surface 42L. In particular, cleaning channel 48 is shown as formed from a front housing side 42F to a rear housing side 42R. The depth d of cleaning channel 48, as well as the location L of leads 44, 46 is also shown in this view, again illustrating the preference that d is less than L to ensure that leads 44, 46 remain encased within housing 42. While only a single cleaning channel is shown in this view, it is to be understood that multiple cleaning channels may be formed. Indeed, FIG. 8 is an isometric view of an alternative embodiment, showing the inclusion of a second cleaning channel 49, in this case formed along a direction orthogonal to cleaning channel 48 (that is, the pair of channels are disposed in a perpendicular configuration).

Figure 9:
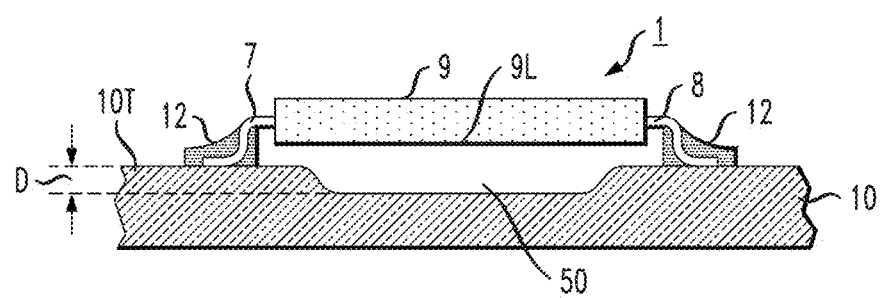
FIG. 9 is a cut-away view of another embodiment of the present invention, in this case comprising a cleaning channel in the top surface of the PCB, the PCB cleaning channel disposed underneath the attachment location of a surface mount integrated circuit package.

FIG. 9 illustrates an alternative cleaning configuration formed in accordance with one or more embodiments of the present invention. In this case, a standard surface mount package (such as package 1 described above) is attached to PCB 10 in the same manner as described above. In this case, however, PCB 10 is formed to include a cleaning channel 50 in a portion of top surface 10T underneath lower surface 9L of housing 9 of PCB 10. The inclusion of cleaning channel 50 in PCB 10 provides the same benefit as cleaning channel 48 described above; that is, promoting more efficient removal of flux residue during a conventional PCB cleaning process. The depth D of cleaning channel 50 is determined by a combination of factors associated with the specific surface mount packages, and typically falls within the same 0.2 mm to 1.0 mm range as defined for cleaning channel 48. Additionally, multiple cleaning channels may also be formed in PCB 10.

Figure 10:
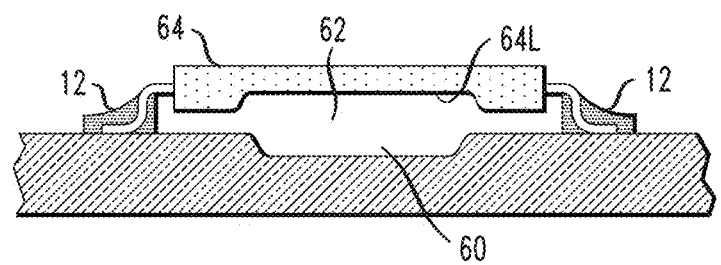
FIG. 10 illustrates yet another embodiment of the present invention, in this case including cleaning channels formed in both the PCB and the surface mount package.

Yet another configuration formed in accordance with one or more embodiments of the present invention is shown in FIG. 10. Here, a first cleaning channel 60 is formed in top surface 10T of PCB 10, and a second cleaning channel 62 is formed in a lower surface 64L of a surface mount package housing 64. The two channels may have different sizes and dimensions, as long as portions overlap in the manner shown in FIG. 10.

Once the cleaning process is completed and the remaining flux residue is removed by virtue of the one or more included cleaning channels, the final structure is encapsulated within a high dielectric strength material. Advantageously, the encapsulation process will also fill in the cleaning channels, minimizing the possibilities of other contaminants from affecting the performance of the final system.

Figure 11:
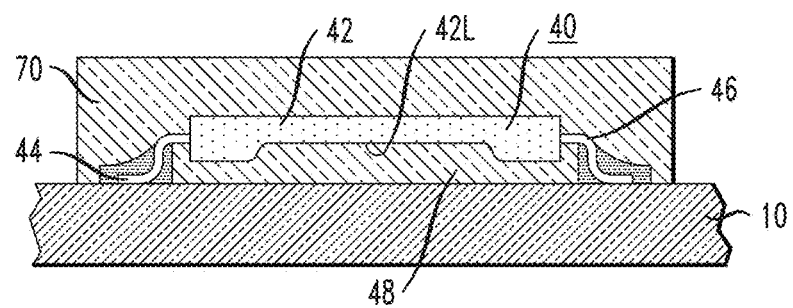
FIG. 11 is a cut-away view of the embodiment of FIG. 5, showing a configuration of the system subsequent to the application of an encapsulant material to the structure.

FIG. 11 illustrates the embodiment of FIG. 5 as enclosed within an encapsulant 70. As shown, a portion of encapsulant 70 will flow to "underfill" all recesses between PCB 10 and surface mount package 40, including cleaning channel 48. The use of a high dielectric strength material as the encapsulant further isolates leads 44, 46 of package 40, increasing the breakdown voltage of the device at the system level. Various suitable materials for use as encapsulant 70 include, but are not limited to an epoxy, a polymer, $SiN_x$, $Al_2O_3$, $SiO_2$, $HfO_2$, $HFSiO_x$, $HFSiON$, $ZrO_2$, or $La_2O_3$.

FIG. 12 is a flow chart of a method of making a packaging system in accordance with one or more embodiments of the present invention. Method 100 begins with operation 105 in which a package (such as surface mount package 40 of FIG. 5) is manufactured. In one or more embodiments, housing 42 of package 40 is manufactured using transfer molding, compression molding, damming-and-filling, or other any other suitable package manufacturing method. In some embodiments, the manufacturing method forms cleaning channel 40 as part of the molding process. In other embodiments, cleaning channel 48 is formed subsequent to the process of forming a conventional housing 42.

In step 110, the package is mounted over a printed circuit board. The package is mounted using a solder paste that includes at least one of lead, tin, silver, zinc, antimony, indium, bismuth, cadmium, gold, aluminum, phosphorus, arsenic, or copper, according to one or more embodiments. In at least one embodiment, the solder paste includes a flux. In at least one embodiment, the solder paste is disposed over leads of the package and connectors of the circuit board. The package is soldered manually or via a machine, in various embodiments.

In step 115, excess solder flux residue is washed off from the circuit board. In some embodiments, the circuit board is cleaned by introducing a cleaning liquid at least in a vicinity of the package. In at least one embodiment, the circuit board is immersed into the cleaning liquid. In one or more embodiments, the cleaning liquid is directly introduced into the cleaning channel(s) of the package. In some embodiments, the circuit board is pressured washed by the cleaning liquid. The cleaning liquid comprises at least one of a solvent, hot water, acetone, or other suitable cleaning liquid, according to some embodiments.

In step 120, a high dielectric strength material (used as an encapsulant) is introduced into the cleaning channel(s). In one or more embodiments, the dielectric material is introduced into the cleaning channel(s) using an underfill process or a jetting process. In some embodiments, the dielectric material is introduced into the cleaning channel(s) using a dam and fill method. The dielectric material is thereafter cured. In at least one embodiment, the dielectric material fills up the cleaning channel after the solder flux residue is cleaned off from the circuit board, and the board is dried.

Various embodiments of the present invention relate to a packaging system. According to one or more embodiments, the packaging system includes a cleaning channel formed between a surface mount integrated circuit package and a printed circuit board. The cleaning channel facilities the removal of solder flux residue during an assembly cleaning process. After the cleaning step, the cleaning channel is filled with a dielectric material. Since solder flux residue can interfere with the functioning of the packaging system by creating electrical paths leading to discharge (via electrochemical migration), removal of such excess solder flux residue reduces the possibility that these paths may be created, thereby providing a higher breakdown voltage for the finished structure. In some embodiments, the cleaning channel is formed in the housing for the package itself; in other embodiments, the cleaning channel is formed in the printed circuit board (or even both the board and the package housing).

Although various embodiments of the present invention have been described in detail, it should be understood that various changes, substitutions and alterations can be made herein without departing from the spirit and scope of the invention as defined by the claims appended hereto. Moreover, the scope of the present invention is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A packaging system including
a surface mounted integrated circuit package;
a printed circuit board for supporting physical attachment and electrical connections to the surface mounted integrated circuit package; and
at least one cleaning channel formed between opposing surfaces of the printed circuit board and the surface mounted integrated circuit package, the at least one cleaning channel providing an enlarged gap therebetween to enhance removal of solder flux residue and minimize electrochemical migration based packaging system failure;
wherein at least a portion of the at least one cleaning channel is formed within a bottom surface of the surface mounted integrated circuit package.

2. The packaging system as defined in claim 1 wherein the at least one cleaning channel comprises a single cleaning channel.

3. The packaging system as defined in claim 1 wherein the at least one cleaning channel comprises a plurality of cleaning channels.

4. The packaging system as defined in claim 3 wherein the plurality of cleaning channels comprises a pair of cleaning channels disposed in a perpendicular configuration.

5. The packaging system as defined in claim 1 wherein the at least one cleaning channel is formed to exhibit a depth in the range of 0.2 mm to 1.0 mm.

6. The packaging system as defined in claim 1 wherein the at least one cleaning channel comprises an upper cleaning channel portion formed within a bottom surface of the surface mounted integrated circuit package and a lower cleaning channel portion formed within a top surface of the printed circuit board, the first and second cleaning channels exhibiting overlap when the surface mounted integrated circuit package is attached to the printed circuit board.

7. The packaging system as defined in claim 1 wherein the packaging system further comprises
a high dielectric constant material disposed to fill the at least one cleaning channel subsequent to a printed circuit board cleaning process.

* * * * *